(12) United States Patent
Schulz-Harder

(10) Patent No.: US 8,069,561 B2
(45) Date of Patent: Dec. 6, 2011

(54) METHOD FOR MANUFACTURING A METAL-CERAMIC SUBSTRATE

(75) Inventor: Jürgen Schulz-Harder, Lauf (DE)

(73) Assignee: Curamik Electronics GmbH, Eschenbach (DE)

( * ) Notice: Subject to any disclaimer, the term of this patent is extended or adjusted under 35 U.S.C. 154(b) by 759 days.

(21) Appl. No.: 12/086,695

(22) PCT Filed: Aug. 22, 2006

(86) PCT No.: PCT/DE2006/001470
§ 371 (c)(1),
(2), (4) Date: Jun. 18, 2008

(87) PCT Pub. No.: WO2007/071218
PCT Pub. Date: Jun. 28, 2007

(65) Prior Publication Data
US 2009/0020321 A1 Jan. 22, 2009

(30) Foreign Application Priority Data
Dec. 19, 2005 (DE) .......... 10 2005 061 049

(51) Int. Cl.
*H01R 43/16* (2006.01)

(52) U.S. Cl. .......... 29/874; 29/831; 29/846; 228/122.1; 228/123.1; 228/262.21

(58) Field of Classification Search .......... 29/847, 29/830–832, 840–842, 846, 887; 228/121, 228/122.1, 123.1, 124.5, 219, 262.21
See application file for complete search history.

(56) References Cited

U.S. PATENT DOCUMENTS
4,611,745 A 9/1986 Nakahashi et al.
5,465,898 A * 11/1995 Schulz-Harder et al. .. 228/122.1

FOREIGN PATENT DOCUMENTS
EP 1 246 514 10/2002
* cited by examiner

*Primary Examiner* — Thiem Phan
(74) *Attorney, Agent, or Firm* — Welsh Flaxman & Gitler LLC

(57) ABSTRACT

A method for manufacturing a metal-ceramic substrate with at least one metallization, patterned by etching, on at least one surface side of a laminar ceramic material. The metal-ceramic substrate includes a base substrate made of an aluminum-nitride or silicon-nitride ceramic. The metallization is applied by active soldering before patterning. An intermediate layer made of an oxidic ceramic is provided between the at least one metallization and the base substrate.

13 Claims, 2 Drawing Sheets

METHOD FOR MANUFACTURING A METAL-CERAMIC SUBSTRATE

BACKGROUND OF THE INVENTION

The invention relates to a metallic substrate and to a method for manufacturing a metal-ceramic substrate.

Metal-ceramic substrates or ceramic substrates with metallizations are known in the art, particularly as circuit boards or substrates for electrical and electronic circuits or modules, especially for high-power circuits or modules.

Also known is the so-called active soldering method (DE 22 13 115; EP-A-153 618) for bonding metal layers or metal foils forming metallizations, in particular also of copper layers or copper foils, with the respective ceramic material. In this process, which is used especially for manufacturing a metal-ceramic substrate, a bond is produced at a temperature of ca. 800-1000° C. between a metal foil, for example copper foil, and a ceramic substrate, for example aluminum-nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

Also known is a method for manufacturing metal ceramic substrates with an aluminum-nitride ceramic (A1N ceramic) base, which is characterized, for example, by higher thermal conductivity as compared with aluminum oxide ceramic (EP 0 480 030). The metallization or the copper foil forming said metallization is applied to the ceramic in this known method by means of active soldering using an active solder, which contains as the solder material copper and a further component, for example silver, and an active solder component, e.g. titanium. The disadvantage of this known method is that the active solder component forms an electrically conductive bond with the aluminum nitride, for example titanium nitride, so that the etching procedure required for patterning of the metallization has to be carried out in at least two steps, namely so that the patterning of the metallization for creating strip conductors, contact surfaces, etc. takes place in a first etching step and in a second, subsequent step the electrically conductive material formed between the strip conductors, contact surfaces, etc. as a result of chemical reactions of the active solder component with the aluminum nitride has to be removed by etching. The removal of this material or reaction product is possible only with very aggressive and highly concentrated etching agents, which have a high impact on the environment, in addition to very demanding production requirements.

It is an object of the invention is to present a metal ceramic substrate with an aluminum-nitride and/or silicon-nitride ceramic base or substrate that eliminates this disadvantage.

SUMMARY OF THE INVENTION

In the case of the invention, the at least one metallization, which is formed for example from a thin plate or a foil made of copper or a copper alloy, is not applied directly to the aluminum-nitride or silicon-nitride ceramic, but instead to an intermediate layer, which is applied to the aluminum-nitride or silicon-nitride ceramic (hereinafter also base ceramic or base layer) and is made of an oxidic ceramic.

Electrically conductive reaction products or layers resulting from the reaction of the active solder component with the ceramic between strip conductors, contact surfaces or similar patterned areas of the metallization or metallizations and which can be removed only with very aggressive and highly concentrated etching agents are effectively eliminated by the invention. The patterning of the metallization can therefore be achieved after its application using the normally used etching agents and in particular using the normal etching methods and the existing equipment.

Suitable oxidic ceramics for the intermediate layer are, for example, silicon oxide, aluminum oxide, mullite, forsterite, cordierite or combinations of these.

The active solder used for application of the metallization can consist of the time-tested composition used in the prior art, for example it can consist of a solder component made of copper and a further solder component, e.g. silver, and of the active solder component, e.g. titanium, zirconium and/or hafnium.

Various methods are possible for applying the intermediate layer. For example, the intermediate layer can be produced by thermal oxidation of the aluminum-nitride or silicon-nitride ceramic, for example at a process temperature between 1000 and 1650° C. Generally, it is also possible to produce the respective intermediate layer by applying a ceramic material forming said layer and by subsequent firing or sintering of this material, for example at a temperature between 1200 and 1650° C. The initial layer forming the intermediate layer is then applied, for example, using a dispersion or dispersive mixture containing the ceramic material of the intermediate layer, preferably using a microdispersive to nanodispersive mixture.

Further, it is possible to apply the initial layer later forming the intermediate layer by means of spraying and/or dip coating and/or spin coating and/or sol-gel coating.

The intermediate layer made of the oxidic ceramic has a thickness that is smaller than the thickness of the base layer or the base substrate made of the aluminum-nitride or silicon-nitride ceramic and/or smaller than the thickness of the at least one metallization.

In the event that the method according to the invention should result in reactions between the active solder component and the silicon-nitride or aluminum-nitride ceramic due to the intermediate layer, for example as a result of process fluctuations, e.g. due to pores produced in the intermediate layer by sintering aids, such as yttrium oxide or rare earth, then it is necessary in the case of the method according to the invention to remove existing titanium, zirconium or hafnium nitrides using hydrofluoric acid or hydrogen peroxide. Since the quantity of this nitride is extremely low, however, the concentration of the etching agent can be minimized in such cases. Only short treatment times are then required for the subsequent etching. Normally, however, such subsequent etching for removal of nitride bonds formed by the active solder component is not necessary in the case of the method according to the invention.

BRIEF DESCRIPTION OF THE DRAWINGS

The invention is explained below in more detail based on an exemplary embodiment with reference to the drawings, wherein.

DETAILED DESCRIPTION OF THE INVENTION

Figure 1:
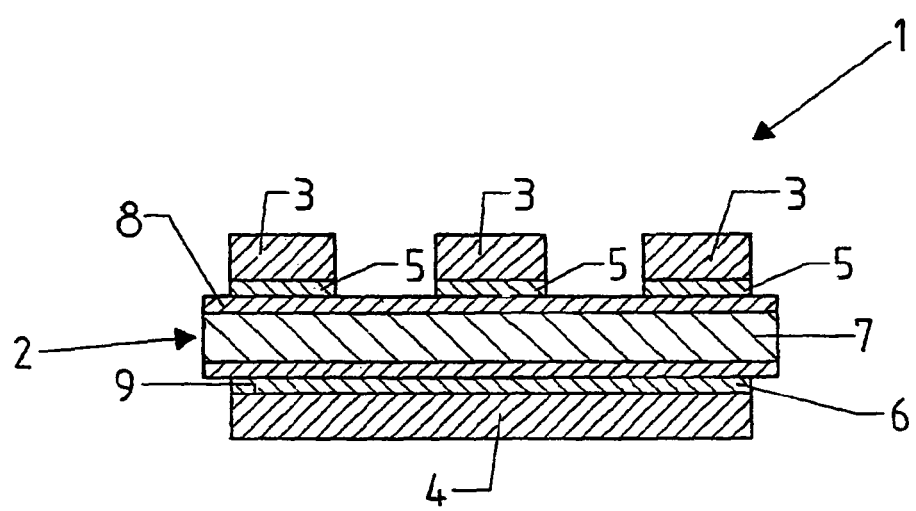
FIG. 1 is a schematic representation of a cross section through a metal-ceramic substrate according to the invention.

The metal-ceramic substrate generally designated 1 in FIG. 1 includes the lamellar ceramic material designated 2 in this Figure and of an upper patterned copper layer or metallization 3 made of a copper foil and a lower, non-patterned copper layer or metallization 4. The two copper layers are bonded two-dimensionally with the ceramic material 2 by a layer 5 and 6 made of an active solder. The ceramic material 2 is made of multiple layers, namely consisting of a middle base layer or a middle base substrate 7 made of an aluminum-nitride or silicon-nitride ceramic and of thin intermediate layers 8 and 9, each of which is applied to one of the two surface sides of the base layer 7 and is made of an oxidic ceramic, for example of silicon oxide, aluminum oxide, mullite, forsterite, cordierite or a combination of these ceramics.

The upper metallization 3 is bonded via the active solder layer 5 with the intermediate layer 8 and via the latter with the base layer 7. The lower metallization 4 is bonded via the active solder layer 6 with the intermediate layer 9 and via the latter likewise with the base layer 7. In detail, the bond between the respective metallization 3 and 4 and the corresponding active solder layer 5 and 6 is a metallic solder bond. The bond between the active solder layer 5 and 6 and the intermediate layer 8 and 9 is based on a chemical reaction between the active solder component and the oxidic ceramic of said intermediate layer.

As shown in FIG. 1, the metallization 3 and the active solder layer 5 are patterned so that the ceramic material 2 is exposed between the metal areas (strip conductors, contact surfaces, etc.) formed by the patterning. As also shown in FIG. 1, the intermediate layers 8 and 9 have a thickness that is much smaller thin the thickness of the base layer 7, but also much smaller than the thickness of the metallizations 3 and 4. The same applies to the active solder layers 5 and 6.

Figure 2:
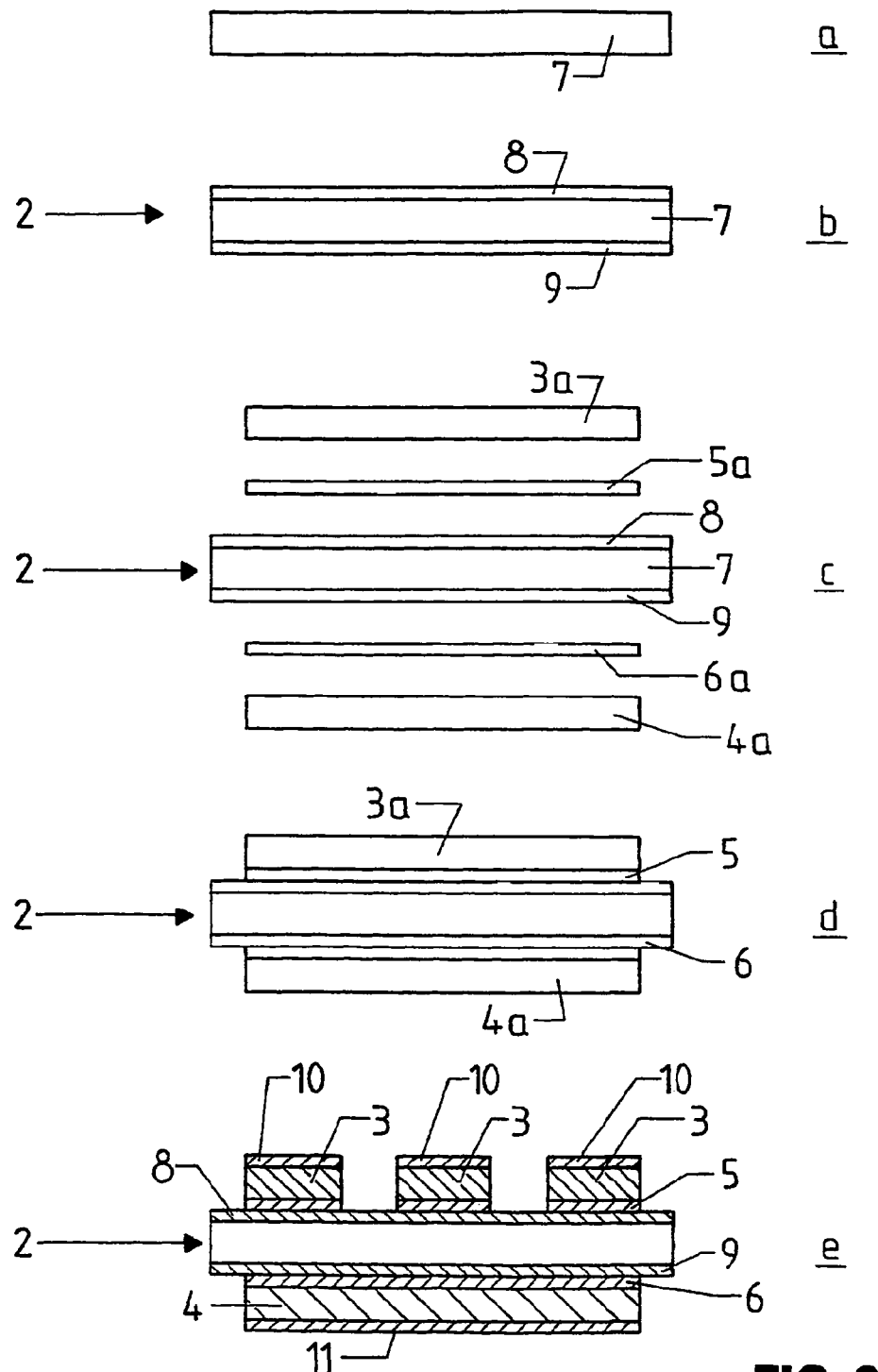
FIG. 2 shows, in various positions a-e, the essential processing steps for manufacturing the metal-ceramic substrate of FIG. 1.

FIG. 2 schematically depicts individual processing steps for manufacturing the metal-ceramic substrate 1. The laminar base substrate 7 made of the aluminum-nitride or silicon-nitride ceramic is used for the starting material (FIG. 2, Position a).

An intermediate layer 8 and 9 is applied to the two surface sides of the base substrate 7, respectively, for example by thermal oxidation of the base layer 7 in an oxygenated atmosphere at a process temperature between 1000 and 1650° C. (FIG. 2, Position b). As explained above, various methods are possible for applying the intermediate layers 8 and 9 to the base layer 7.

In a further process step, the metallizations 3 and 4 are applied by active soldering using an active solder forming one of the active solder layers 5 and 6. In FIG. 2 it is assumed that the active solder is used in the form of an active solder foil 5a and 6a These foils are then applied together with the foils 3a and 4a forming the metallizations 3 and 4 to the surface sides of the base layer 7 provided with the intermediate layers 8 and 9 and then bonded with the base layer 7 or with the intermediate layers 7 and 8 there (FIG. 2, Positions c and d) by means of the active soldering process at the corresponding process temperate of 800-1000° C. The not yet patterned metal-ceramic substrate produced in this manner is then masked with the masks 10 and 11 corresponding to the exposed surfaces of the metallizations (FIG. 2, Position e). This is followed by patterning by means of etching and subsequent removal of the masks 10 and 11.

The invention was described above based on an exemplary embodiment. It goes without saying that numerous modifications and variations are possible without abandoning the underlying inventive idea upon which the invention is based.

REFERENCE LIST 1 metal-ceramic substrate
2 ceramic material
3, 4 metallization
3a, 4a metal or copper roll
5, 6 active solder layer
5a, 6a active solder foil
7 base layer or base substrate
8, 9 intermediate layer
10, 11 mask

What is claimed is:

1. A method for manufacturing a metal-ceramic substrate with of at least one metallization on at least one surface of a lamellar ceramic material, the method comprising the steps of:
 (a) applying an intermediate layer made of an oxidic ceramic, each to one of the two surface sides of a base substrate made of an aluminum-nitride or silicon-nitride for forming the lamellar ceramic material,
 (b) applying a copper foil forming the at least one metallization to the intermediate layer by active soldering,
 (c) subsequently patterning or structuring the copper foil by etching to form metal areas in a form of strip conductors, or contact surfaces, and using an etching agent suitable for copper, and
 (d) removing unneeded active solder residue on the lamellar ceramic material after patterning of the copper foil by etching.

2. The method according to claim 1, wherein silicon oxide, aluminum oxide, mullite, forsterite, cordierite or a combination of these is used for the intermediate layer.

3. The method according to claim 1, wherein copper and an additional solder component is used as the active solder with at least one active solder component selected from Ti, Zr, or Hf.

4. The method according to claim 1, wherein the intermediate layer is produced by thermal oxidation of the base substrate, at a process temperature between 1000 and 1650° C.

5. The method according to claim 1, wherein the intermediate layer is achieved by applying the material forming said layer and by subsequent firing of the intermediate layer, at a temperature between 1200 and 1650° C.

6. The method according to claim 1, wherein the intermediate layer is applied using a dispersion or dispersive mixture containing the ceramic material of said intermediate layer, using a microdispersive to nanodispersive mixture.

7. The method according to claim 1, wherein the intermediate layer is applied by spraying, dip coating, spin coating or sol-gel coating.

8. The method according to claim 1, wherein the intermediate layer is applied with a thickness that is much smaller than the thickness of the base substrate or of the at least one metallization.

9. The method according to claim 1, wherein after patterning of the metallizations, titanium, hafnium or zirconium nitride residue is removed by etching.

10. The method according to claim 9, wherein the removal of unneeded active solder residue and the removal of titanium, hafnium or zirconium nitride residue takes place in a common etching step.

11. The method according to claim 1, wherein patterning or structuring is performed in a first etching step and removing of unneeded active solder residue is performed in a second etching step.

12. A method for manufacturing a metal-ceramic substrate with of at least one metallization on a surface of a lamellar ceramic material, the method comprising the steps of:
 (a) applying an intermediate layer made of an oxidic ceramic, each to one of the two surface sides of a base substrate made of an aluminum-nitride or silicon-nitride for forming the lamellar ceramic material,
(b) applying a copper foil to the intermediate layer by active soldering so as to form the at least one metallization, and
(c) subsequently patterning the copper foil by etching in a first etching step and by using an etching agent suitable for copper, wherein the intermediate layer is applied using a dispersion or dispersive mixture containing the lamellar ceramic material of the intermediate layer, using a microdispersive to nanodispersive mixture.

13. A method for manufacturing a metal-ceramic substrate with of at least one metallization on a surface of a lamellar ceramic material, the method comprising the steps of:

(a) applying an intermediate layer made of an oxidic ceramic, each to one of the two surface sides of a base substrate made of an aluminum-nitride or silicon-nitride for forming the lamellar ceramic material,
(b) applying a copper foil to the intermediate layer by active soldering forming the at least one metallization, and
(c) subsequently patterning the copper foil by etching in a first etching step and by using an etching agent suitable for copper, wherein the intermediate layer is applied by spraying, dip coating, spin coating, sol-gel coating or combinations thereof.

* * * * *